United States Patent
Rajasekhar (10) Patent No.: US 10,409,312 B1
(45) Date of Patent: Sep. 10, 2019

(54) LOW POWER DUTY-CYCLED REFERENCE

(71) Applicant: Analog Devices Global Unlimited Company, Hamilton (BM)

(72) Inventor: Sanjay Rajasekhar, Newbury (GB)

(73) Assignee: Analog Devices Global Unlimited Company, Hamilton (BM)

(*) Notice: Subject to any disclaimer, the term of this patent is extended or adjusted under 35 U.S.C. 154(b) by 0 days.

(21) Appl. No.: 16/040,207

(22) Filed: Jul. 19, 2018

(51) Int. Cl.
| | |
|---|---|
| G05F 3/30 | (2006.01) |
| G05F 3/24 | (2006.01) |
| H03M 1/38 | (2006.01) |
| H03M 1/08 | (2006.01) |
| H03M 1/00 | (2006.01) |

(52) U.S. Cl.
CPC ............ G05F 3/245 (2013.01); H03M 1/002 (2013.01); H03M 1/089 (2013.01); H03M 1/0845 (2013.01); H03M 1/38 (2013.01)

(58) Field of Classification Search
CPC combination set(s) only.
See application file for complete search history.

(56) References Cited

U.S. PATENT DOCUMENTS

| | | | |
|---|---|---|---|
| 4,633,165 A * | 12/1986 | Pietkiewicz | G05F 3/30 323/314 |
| 5,563,504 A | 10/1996 | Gilbert et al. | |
| 5,821,807 A | 10/1998 | Brooks | |
| 5,838,192 A * | 11/1998 | Bowers | G05F 3/247 327/541 |
| 5,867,012 A | 2/1999 | Tuthill | |
| 6,356,161 B1 | 3/2002 | Nolan et al. | |
| 6,791,307 B2 * | 9/2004 | Harrison | G05F 3/267 323/312 |

(Continued)

FOREIGN PATENT DOCUMENTS

| | | |
|---|---|---|
| CN | 104199509 | 12/2014 |
| WO | 2004077192 | 9/2004 |

OTHER PUBLICATIONS

Atkinson, Nicholas M., "System-Level Radiation Hardening of Low-Voltage Analog Mixed-Signal Circuits", Ph.D Dissertation, Vanderbilt University, (Dec. 2013), 230 pgs.

(Continued)

*Primary Examiner* — Adam D Houston
(74) *Attorney, Agent, or Firm* — Schwegman Lundberg & Woessner, P.A.

(57) ABSTRACT

A duty cycled voltage reference circuit is turned on and off synchronously with the operation of a second, reference-consuming, duty-cycled circuit to which it supplies a reference. When the reference consuming circuit no longer has need of the reference, the voltage reference circuit itself is then also powered down. The reference circuit is then powered back up for the next duty cycle sufficiently in advance of the reference consuming circuit such that any auto-zeroing and noise filtering operations required by the reference circuit are complete and a stable reference voltage is output at least simultaneously with, or slightly before, the reference consuming circuit begins to make use of the voltage reference signal. In this manner, synchronous duty-cycled operation of the voltage reference circuit with the reference-consuming circuit is obtained, with the consequence that power consumption by the reference circuit is reduced.

20 Claims, 7 Drawing Sheets

(56) References Cited

U.S. PATENT DOCUMENTS

| | | | |
|---|---|---|---|
| 6,828,847 B1* | 12/2004 | Marinca | G05F 3/30 |
| | | | 323/316 |
| 6,853,238 B1 | 2/2005 | Dempsey et al. | |
| 6,885,178 B2 | 4/2005 | Marinca | |
| 6,891,358 B2* | 5/2005 | Marinca | G05F 3/30 |
| | | | 323/315 |
| 7,173,407 B2* | 2/2007 | Marinca | G05F 3/262 |
| | | | 323/316 |
| 7,193,454 B1* | 3/2007 | Marinca | G05F 3/30 |
| | | | 327/538 |
| 7,342,390 B2 | 3/2008 | Tachibana et al. | |
| 7,576,598 B2* | 8/2009 | Marinca | G05F 3/30 |
| | | | 323/314 |
| 7,598,799 B2* | 10/2009 | Marinca | G05F 3/30 |
| | | | 327/539 |
| 7,612,606 B2 | 11/2009 | Marinca | |
| 7,683,701 B2 | 3/2010 | Georgescu et al. | |
| 7,714,563 B2 | 5/2010 | Marinca | |
| 7,728,575 B1* | 6/2010 | Ozalevli | G05F 3/30 |
| | | | 323/313 |
| 7,880,533 B2* | 2/2011 | Marinca | G05F 3/30 |
| | | | 327/539 |
| 8,008,966 B2 | 8/2011 | Cho | |
| 8,106,707 B2* | 1/2012 | Katyal | G05F 3/30 |
| | | | 323/313 |
| 8,258,854 B2 | 9/2012 | Pan | |
| 8,305,068 B2* | 11/2012 | Camacho Galeano | |
| | | | G05F 3/262 |
| | | | 323/313 |
| 8,648,648 B2* | 2/2014 | Choi | G05F 3/30 |
| | | | 323/313 |
| 8,710,912 B2* | 4/2014 | Marinca | G05F 3/30 |
| | | | 327/539 |
| 8,717,090 B2 | 5/2014 | Marinca et al. | |
| 8,931,953 B2 | 1/2015 | Law et al. | |
| 9,641,129 B2* | 5/2017 | Coimbra | H03F 1/0205 |
| 9,703,306 B2* | 7/2017 | Day | G05F 1/625 |
| 9,705,525 B1* | 7/2017 | Singh | H03M 3/458 |
| 9,748,969 B1 | 8/2017 | Bach et al. | |
| 9,857,814 B2 | 1/2018 | Cohen et al. | |
| 9,971,376 B2 | 5/2018 | Lee | |
| 9,977,111 B2 | 5/2018 | Li | |
| 10,037,045 B2 | 7/2018 | Wan et al. | |
| 2004/0017224 A1 | 1/2004 | Tumer | H03F 3/087 |
| | | | 327/51 |
| 2004/0124822 A1 | 7/2004 | Marinca | |
| 2008/0074172 A1 | 3/2008 | Marinca | |
| 2008/0278137 A1* | 11/2008 | Harvey | G05F 3/30 |
| | | | 323/311 |
| 2009/0243708 A1 | 10/2009 | Marinca | |
| 2010/0073572 A1* | 3/2010 | Burns | H03G 3/3036 |
| | | | 348/707 |
| 2010/0301832 A1 | 12/2010 | Katyal et al. | |
| 2011/0084681 A1* | 4/2011 | Herbst | G05F 3/30 |
| | | | 323/313 |
| 2011/0200070 A1 | 8/2011 | Makinwa et al. | |
| 2012/0169413 A1 | 7/2012 | Choi | |
| 2013/0099955 A1 | 4/2013 | Shaeffer et al. | |
| 2013/0162341 A1* | 6/2013 | Temkine | G05F 3/30 |
| | | | 327/539 |
| 2013/0293401 A1* | 11/2013 | Werking | H03M 3/388 |
| | | | 341/120 |
| 2014/0030995 A1* | 1/2014 | Kim | H04B 1/10 |
| | | | 455/295 |
| 2014/0092939 A1* | 4/2014 | Chang | G01K 7/01 |
| | | | 374/178 |
| 2015/0323950 A1 | 11/2015 | Marinca et al. | |
| 2016/0003683 A1* | 1/2016 | Leow | G01K 1/024 |
| | | | 702/130 |
| 2017/0255221 A1 | 9/2017 | Marinca et al. | |
| 2018/0074533 A1 | 3/2018 | Kamath et al. | |

OTHER PUBLICATIONS

Basyurt, Pinar Basak, "Fully Integrated Voltage Reference Circuits", Ph.D Thesis, Istanbul Technical University, (Apr. 2014), 172 pgs.

Lee, Anders Wen-Dao, "The Design of a High Precision, Wide Common Mode Range Auto-Zero Comparator", MEng. Thesis, MIT, (Jun. 2015), 90 pgs.

Liu, Maoqiang, "15.4 A 0.8V 10b 80kS s SAR ADC with Duty-Cycled Reference Generation", IEEE ISSCC, Data-Converter Techniques, 15.4, (Feb. 2015), 3 pgs.

Mercer, D., "Voltage References", Analog Devices Wiki, Intro to Electronics I and II, Ch. 14, URL: https: wiki. analog.com university courses electronics text chapter-14?rev=1380480718, (accessed Jul. 25, 2018), 9 pgs.

Souri, Kamran, "A CMOS Temperature Sensor With a Voltage-Calibrated Inaccuracy of 0.15 C (3 ) From 55 C to 125 C", IEEE, (Jan. 2013), 10 pgs.

Souri, Kamran, "A 0.12 mm2 7.4 m W Micropower Temperature Sensor With an Inaccuracy of 0.2 C (3 s) From −30 C to 125 C", IEEE Journal of Solid-State Circuits, vol. 46, No. 7, (Jul. 2011), 8 pgs.

"U.S. Appl. No. 15/969,175, Non Final Office Action dated Sep. 14, 2018", 6 pgs.

"U.S. Appl. No. 15/969,175, Notice of Allowance dated Jan. 14, 2019", 5 pgs.

"U.S. Appl. No. 15/969,175, Response filed Dec. 14, 2018 to Non Final Office Action dated Sep. 14, 2018", 9 pgs.

"Ultralow Noise, LDO XFET Voltage References with Current Sink and Source", Analog Devices Data Sheet—ADR440/ADR441/ADR443/ADR444/ADR445, (2016), 18 pgs.

Filanovsky, I. M., et al., "0.6-V Supply Voltage References for CMOS Technology Based on Threshold-Voltage-Difference Architecture", IEEE, (2005), 1790-1793.

Magnelli, Luc, et al., "A 2.6 nW, 0.45 V Temperature—Compensated Subthreshold CMOS Voltage Reference", IEEE Journal of Solid-State Circuits, 46, 2, (Feb. 2011), 465-474.

Song, Ho-Jun, et al., "A Temperature-Stabilized SOI Voltage Reference Based on Threshold Voltage Difference Between Enhancement and Depletion NMOSFET'ss", IEEE Journal of Solid-State Circuits, vol. 28, No. 6, (Jun. 1993), 671-677.

Toledo, Luis, et al., "A new CMOS voltage reference scheme based on A new CMOS voltage reference scheme based on Vth-difference principle", IEEE, (2007), 3840-3843.

* cited by examiner

LOW POWER DUTY-CYCLED REFERENCE

FIELD OF THE DISCLOSURE

The disclosure relates to a duty-cycled reference circuit that provides a temperature stabilized voltage reference signal having low noise characteristics whilst having low power consumption.

BACKGROUND

Bandgap voltage reference circuits combine a signal from a Proportional to Absolute Temperature (PTAT) source with a signal from a Complementary to Absolute Temperature (CTAT) source to provide a temperature independent and stabilized voltage reference signal, that can then be used in all manner of circuitry, including RF circuitry such as modulators, demodulators, and phase-locked loops, as well as in digital circuitry such as analog-to digital to converters (ADCs). In order to limit the noise bandwidth of the reference signal, often large (µF size) capacitors are used at the output of the reference, which means that the bandgap voltage reference circuit is constantly powered to provide a constant reference source, as it would not be energy efficient to charge and discharge such large capacitors to duty cycle the reference. Hence even though the actual reference signal may not be needed by the system that uses it all the time, because of the presence of the large noise filtering capacitor such references are usually continually operated whilst the system is powered up, hence wasting power.

SUMMARY OF THE DISCLOSURE

The present disclosure relates to a duty cycled voltage reference circuit that is turned on and off synchronously with the operation of a second circuit to which it supplies a reference. The second circuit may be an analog to digital converter (ADC), and particularly a SAR ADC, but may also be any other reference-consuming circuit that is itself duty cycled on or off as it is needed to operate, or if it is not itself duty cycled on or off, then its need for a reference signal is duty-cycled i.e. it does not need a reference voltage all the time, but for only some of the time. The voltage reference circuit comprises a bandgap voltage reference source that supplies PTAT and CTAT reference signals to a capacitive amplifier, that samples and combines the PTAT and CTAT signals into a reference to be output, and holds the reference for the required amount of time for the reference consuming circuit. However, when the reference consuming circuit no longer has need of the reference, for example by itself being powered down, the voltage reference circuit itself is then also powered down. The voltage reference circuit is then powered back up for the next duty cycle sufficiently in advance of the reference consuming circuit requiring the reference such that any auto-zeroing and noise filtering operations required by the reference circuit are complete and a stable reference voltage is being output at least simultaneously with, and in some cases slightly before, the reference consuming circuit beginning to make use of the voltage reference signal. In this manner, synchronous duty-cycled operation of the voltage reference circuit with the reference-consuming circuit is obtained, which means that the voltage reference is only powered on for those times when it is either filtering noise or settling, or providing a reference to the reference-consuming circuit whilst the reference-consuming circuit requires a reference signal, and is powered down at other times. As a consequence, lower power operation is obtained than would otherwise be the case where the reference operates continuously.

In addition, the use of a capacitive amplifier, which is provided with small (nF) capacitances to sample the PTAT and CTAT signals, and to hold the combined signals in feedback, provides a further advantage in that it removes the need for a large (µF) capacitor at the output of the bandgap reference circuitry. The amplifier itself acts as the reference buffer for the duration of operation of the reference consuming circuit, with the further advantage that once the reference voltage has been established, it will be held by the capacitive amplifier without the need for the bandgap voltage reference circuitry (i.e. the PTAT/CTAT circuitry) to operate, which means that the bandgap voltage reference circuitry can be shut down earlier in the duty cycle than the capacitive amplifier, thus further saving power.

In view of the above, from a first aspect the present disclosure relates to a temperature stabilized reference voltage circuit for supplying a temperature stabilized reference voltage signal (Vref) to a second circuit that requires the reference voltage signal, the temperature stabilized reference voltage circuit comprising: a bandgap voltage reference circuit arranged in use to generate a complementary to absolute temperature (CTAT) signal (Vbe) and a proportional to absolute temperature (PTAT) signal (Dvbe); and a capacitive amplifier arranged to receive the CTAT and PTAT signals generated by the bandgap voltage reference circuit, and to combine the CTAT and PTAT signals to produce a temperature stabilized reference voltage signal (Vref) that is output in use to the second circuit that requires the reference voltage signal; wherein the temperature stabilized reference voltage circuit is in use operated synchronously with the second circuit such that the capacitive amplifier makes the reference voltage signal available to the second circuit at least immediately prior to the start of and during a time period in a duty cycle of the second circuit when the second circuit will make use of the reference voltage signal, and the temperature stabilized reference voltage circuit is powered down and does not provide the reference voltage signal at other times in the duty cycle of the second circuit. As such, low power reference operation is obtained because the reference operates when a reference signal is required by the circuit that consumes the reference signal, and does not operate at other times.

In an example the circuit powers up sufficiently before the time period in the duty cycle of the second circuit when the second circuit will make use of the reference voltage signal to allow calibration operations to occur. As a result, the reference can present an appropriately calibrated reference signal to the second circuit. In some examples the calibration operations comprise one or both of: i) auto-zeroing; and/or ii) noise filtering.

In an example the bandgap voltage reference circuit provides the PTAT and CTAT signals to the capacitive amplifier during a calibration phase whilst the reference voltage signal is being established, and then once the reference voltage signal is established the bandgap voltage reference circuit is powered down. With such operation the reference circuit as a whole can be made to consume lower power than otherwise, as the bandgap voltage reference circuit is not required to be powered for the whole time that the whole reference circuit is powered and providing a reference output signal.

In an example the second circuit is an analog-to-digital converter (ADC), and the capacitive amplifier makes the reference voltage signal available to the ADC at least immediately prior to the conversion phase of the ADC, the temperature stabilized reference voltage circuit being powered down between ADC conversion phases. As such, the reference signal is available when needed for analog-to-digital conversion. In an example the temperature stabilized reference voltage circuit powers up sufficiently in advance of an ADC conversion phase to allow calibration operations to be complete and the reference voltage signal to be established synchronously with the start of the ADC conversion phase. The temperature stabilized reference voltage circuit may then power down immediately after the end of the ADC conversion phase. Such operation further decreases power consumption of the reference circuit.

From a second aspect the present disclosure also relates to a capacitive amplifier for generating a temperature stabilized reference voltage signal (Vref), the capacitive amplifier comprising: a capacitive network including at least one input capacitor and at least one feedback capacitor; a voltage amplifier in series with a calibration capacitor and a transconductance amplifier, the feedback capacitor of the capacitive network providing in use a feedback loop from the output of the transconductance amplifier to the input of the voltage amplifier; and a resistor in series with the output of the voltage amplifier and the calibration capacitor; wherein in use the capacitive network receives a complementary to absolute temperature (CTAT) signal (Vbe) and a proportional to absolute temperature (PTAT) signal (Dvbe) and stores signals derived therefrom on one or more of the input capacitor and the feedback capacitor, noise in the signals being amplified by the voltage amplifier to give a resulting amplified noise signal that is stored in the calibration capacitor during a calibration operation of the capacitive amplifier, the resistor being connected in series with the calibration capacitor to provide a band-limiting filter to band-limit the amplified noise signal. With such operation then lower noise operation is obtained, which further helps to reduce power consumption.

In an example the capacitive network comprises two input capacitors and one feedback capacitor, a first one of the two input capacitors having a first plate that is connectable to the CTAT signal (Vbe), and a second one of the two input capacitors having a first plate connectable to the PTAT signal (Dvbe), respective second plates of the two input capacitors being connected to the input of the voltage amplifier.

In an example the capacitive amplifier undertakes the calibration operation prior to producing a voltage reference. The calibration operation may include feeding the band-limited amplified noise signals stored on the calibration capacitor to the input of the transconductance amplifier. The calibration operation may also include establishing the feedback loop from the output of the transconductance amplifier to the input of the voltage amplifier via the feedback capacitor and at the same time switching the at least one input capacitor so that the input plate thereof is grounded, thereby establishing a combined CTAT and PTAT signal within at least one capacitor of the capacitive network, the voltage amplifier and transconductance amplifier acting to generate the voltage reference in dependence on the combined CTAT and PTAT signal.

A yet further aspect of the disclosure provides a method of generating a temperature stabilized reference voltage signal for use by a duty-cycled reference-consuming circuit, the method comprising: generating a complementary to absolute temperature (CTAT) signal (Vbe) and a proportional to absolute temperature (PTAT) signal (Dvbe); and combining the CTAT and PTAT signals to produce a temperature stabilized reference voltage signal (Vref) that is output in use to the duty-cycled reference-consuming circuit; wherein the reference voltage signal is produced at least immediately prior to the start of and during a time period in a duty cycle of the reference-consuming circuit when the reference-consuming circuit will make use of the reference voltage signal, and the reference voltage signal is not produced at other times in the duty cycle of the reference consuming circuit.

In an example immediately prior to production of the reference voltage signal calibration operations occur to ensure the reference voltage signal is produced at a correct signal level. The calibration operations may comprise one or both of: i) auto-zeroing; and ii) noise filtering.

In an example the PTAT and CTAT signals are generated during a calibration phase whilst the reference voltage signal is being established, and then once the reference voltage signal is established the PTAT and CTAT signals stop being generated.

In some examples the reference consuming circuit is an analog-to-digital converter (ADC), and the reference voltage signal is available to the ADC at least immediately prior to the conversion phase of the ADC, the reference voltage signal being unavailable by not being produced between ADC conversion phases.

In further examples the method may further comprise undertaking calibration operations sufficiently in advance of an ADC conversion phase to allow the calibration operations to be complete and the reference voltage signal to be established synchronously with the start of the ADC conversion phase. In some even further examples the reference voltage may cease to be produced immediately after the end of the ADC conversion phase. All of such operations help to contribute to lowering the power consumption of the reference generating circuit.

Further features, examples, and advantages of the present disclosure will be apparent from the following description and from the appended claims.

BRIEF DESCRIPTION OF THE DRAWINGS

Examples of the present disclosure will now be described with reference to the accompanying drawings, wherein like reference numerals refer to like parts, and wherein: —

DETAILED DESCRIPTION

The present disclosure relates to a duty cycled voltage reference circuit that consumes less power than previous such circuits, by virtue of it being duty-cycled synchronously with a second, reference-consuming, duty-cycled circuit, to which the voltage reference circuit provides a reference. In particular, by controlling the duty cycle of the voltage reference circuit with reference to the duty cycle of the second, reference-consuming, circuit, and specifically ensuring that the voltage reference circuit is outputting a stable voltage reference signal at least simultaneously with or slightly before the second circuit requires the reference, and for at least the duration of the need of the second circuit for the reference, then at other times when the reference signal is not needed by the second circuit the reference circuit can be powered down, thus saving power.

In order to provide for such operation the voltage reference circuit of the present disclosure does not make use of any large (i.e. μF size) capacitors to noise filter a bandgap reference source, but instead uses a capacitive amplifier provided with small capacitors (i.e. nF, or at least ⅟₁₀₀₀th the size) to noise filter and hold the reference at least for the particular time that the reference signal is required per duty cycle, but with the voltage reference circuit then being powered off for the remainder of the duty cycle when it is not either providing the reference or preparing to output the reference (i.e. auto-zeroing and noise filtering).

Figure 1:
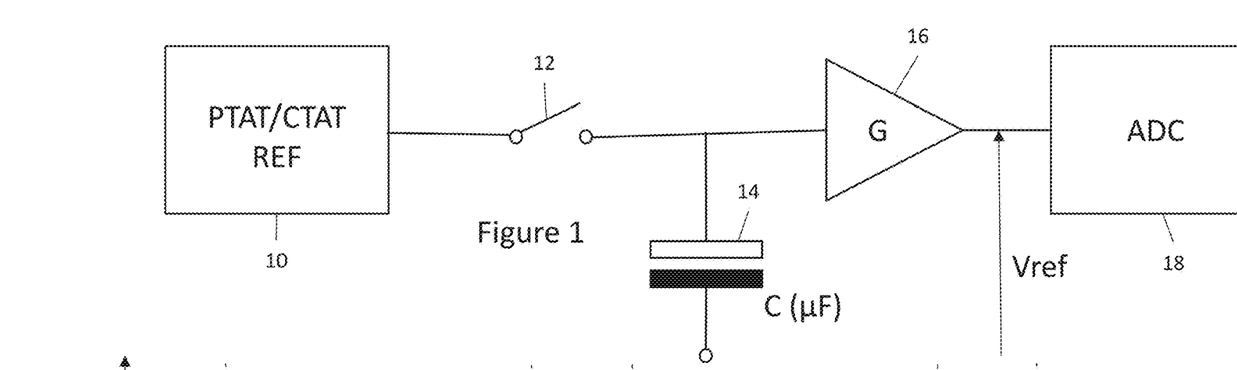
FIG. 1 is a diagram of a prior art bandgap reference circuit.

The operation of the voltage reference circuit of the present disclosure will be made clear by first considering an alternative reference circuit which makes use of a large (μF-size) capacitor, as mentioned above. Such a circuit is shown in FIG. 1, wherein a voltage bandgap reference source 10 provides a temperature stabilized reference signal to a large capacitor 14, via switch 12. The temperature stabilized reference signal is obtained by combining PTAT and CTAT signals in the voltage bandgap reference source 10. In this example the reference source 10 is regularly turned on and off, and the switch 12 is operated synchronously with the reference source 10 such that when the reference source 10 is turned on the switch 12 is closed, so that the reference source charges the large capacitor 14. When the reference source 10 is turned off the switch 12 is opened, and the large capacitor 14 slowly discharges via voltage amplifier 16, with the resulting output voltage of the voltage amplifier 16 than being the output reference voltage Vref. This reference voltage may then be used by a reference consuming circuit, such as in this case an ADC 18.

Figure 2:
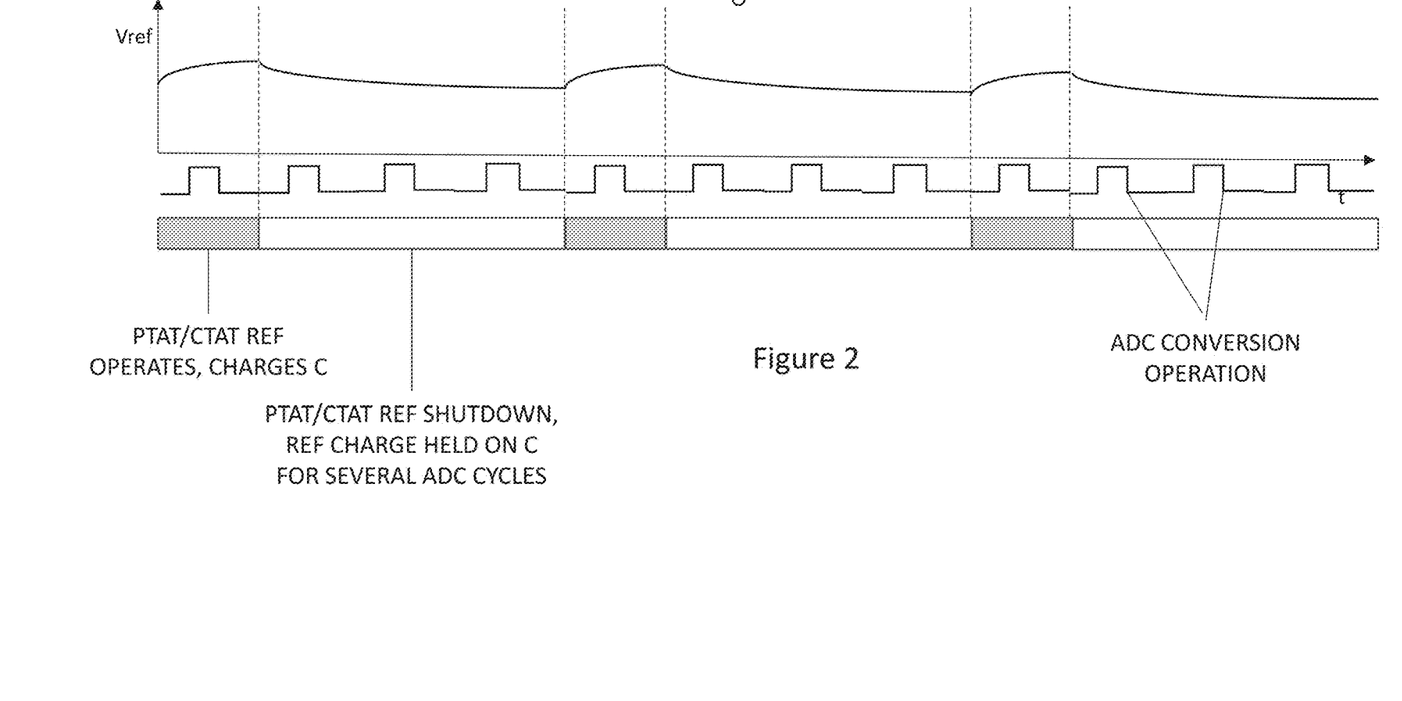
FIG. 2 is a timing diagram of the operation of the prior art reference circuit of FIG. 1.

FIG. 2 illustrates the operation of the arrangement in more detail. In particular, as the voltage reference 10 operates and switch 12 is closed (or turned on, where the switch is a FET or the like) then the charge on the capacitor and hence voltage across it increases and the slightly increasing reference Vref is produced, as shown. Then, when switch 12 is opened (i.e. the FET is turned off), and the voltage reference is shut down, the voltage held on the capacitor slowly decays, producing the slightly declining reference Vref, again as shown. The operation of the reference source 10, switch 12, capacitor 14 and amplifier 16 alternates between these two modes (i.e. charge and discharge modes) of operation, with the result that a continuous, almost continually level, reference is provided, even though the voltage reference circuit 10 is not continually operating. As can be seen by way of example from FIG. 2, for each charge and hold cycle of the capacitor 14, several ADC operating cycles may take place (in this example 4 ADC conversion cycles for each charge and hold cycle of the reference source).

The above arrangement has some advantages in that it does not require the bandgap voltage reference source 10 to operate continuously, even though a continuous reference voltage is produced, and hence some power is saved. However, in order to obtain such operation a large capacitor 14 is required, typically measured in tens or hundreds of μF, which itself consumes power to be charged up and maintain its charge, and which also uses lots of chip area in an integrated circuit implementation. An alternative arrangement which can avoid the use of such a large capacitor whilst still providing the power saving advantages of duty cycling the bandgap voltage reference source 10 would therefore be useful.

Figure 3:
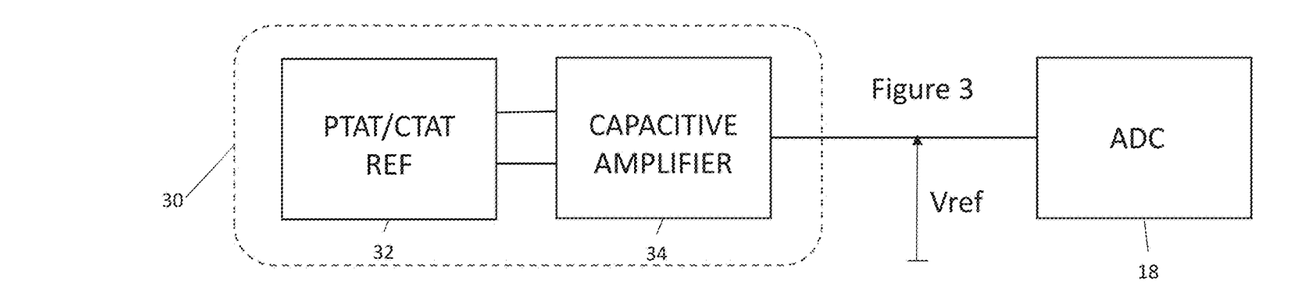
FIG. 3 is a diagram of a voltage reference circuit according to an example of the present disclosure.
Figure 4:
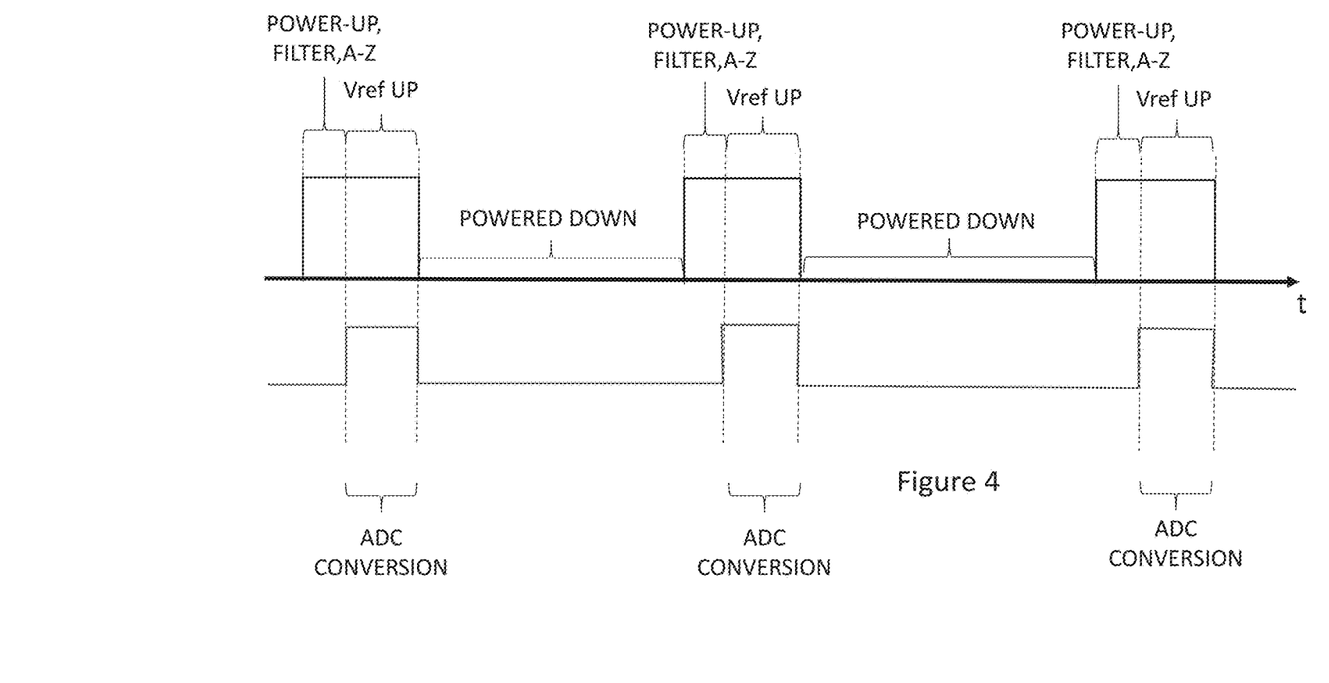
FIG. 4 is a timing diagram of the operation of the voltage reference circuit of FIG. 3.

FIGS. 3 and 4 illustrate a voltage reference circuit that does not require the use of such a large capacitor, as an example of the present disclosure. In particular, FIG. 2 shows a voltage reference circuit 30 that includes a bandgap voltage reference circuit 32, which may be of conventional construction, and which provides PTAT and CTAT output signals in the form of PTAT signal Dvbe, and CTAT signal Vbe. The Dvbe and Vbe signals are then fed to a capacitive amplifier 34, the further specific details of which are described later. The capacitive amplifier 34 generates the output reference voltage Vref in a manner to be described, and the output reference voltage is then used by a second, reference-consuming, circuit or system, such as, in this example, an ADC 18.

In order to save power, the voltage reference 30 according to the present example operates synchronously with the reference consuming circuit, here the ADC 18, as shown in FIG. 4. In particular, the voltage reference 20 operates on a duty cycle that is synchronous with the duty cycle of the reference consuming circuit, in that the voltage reference 20 is powered up just sufficiently before the reference consuming circuit starts to require the reference such that the voltage reference 20 can complete any calibration operations required to generate a steady reference and then output the voltage reference signal either simultaneously with or just in advance of the reference signal being required by the reference consuming circuit (ADC) 18. Once the reference consuming circuit 18 has finished the operation that it needs the voltage reference signal for (for example, in this case an ADC conversion operation), the voltage reference 30 can then completely power down, and wait until the next duty cycle of the reference consuming cycle to begin before powering up again, as shown in FIG. 4. By operating in this way the voltage reference source 30 need only be powered up when actually required by the reference consuming circuit, and hence power is saved by not operating the voltage reference source when not required.

Figure 5:
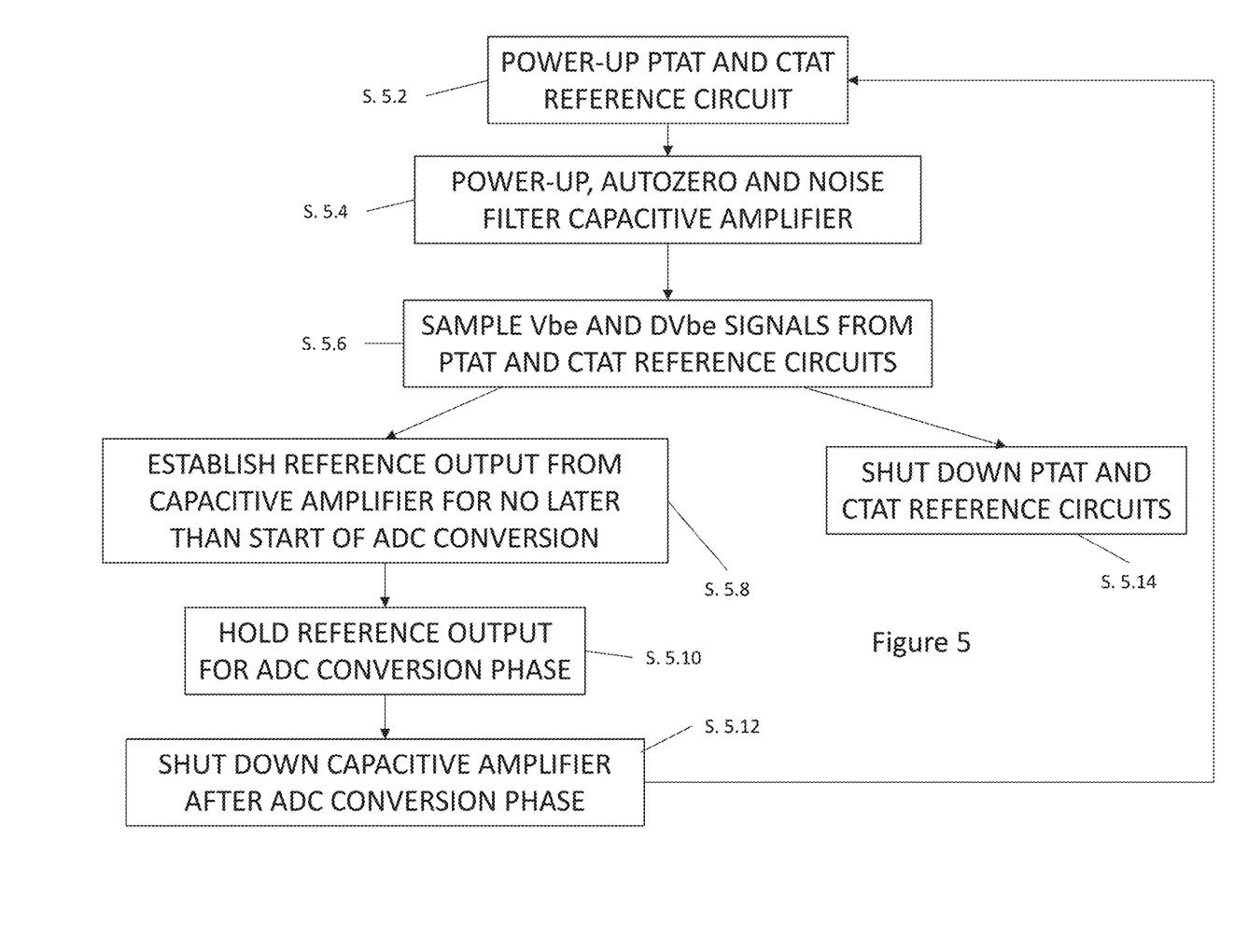
FIG. 5 is a flow diagram illustrating the operation of the voltage reference circuit of FIG. 3.

The above described operation is shown in more detail in FIG. 5. Firstly, at s.5.2 the bandgap reference circuit 32 is powered up, and Dvbe and Vbe signals produced. Then, at s.5.4 the capacitive amplifier 34 is powered up, and autozero and noise filtering operations occur to calibrate the amplifier. Further details of these operations will be given later, with reference to the specific circuit.

Once the capacitive amplifier is up and calibrated, it samples the Dvbe and Vbe signals from the bandgap reference circuit, at s.5.6. Once this sampling has taken place the bandgap reference circuit can then be shut down (s.5.14), and the capacitive amplifier uses the sampled Dvbe and Vbe signals to establish an output reference voltage Vref. As noted above, in terms of timing of the establishment of this signal, Vref should be established no later than the start of the time period in which the reference consuming circuit will use the reference. For example, where the reference consuming circuit is an ADC, the reference should be up and stable by no later than the start of the ADC conversion phase (s.5.8).

Once the output reference signal Vref has been established it is then held for at least the amount of time for which it is required by the reference consuming circuit in the present duty cycle. For example, where the reference consuming circuit is an ADC, then the output reference signal Vref is maintained by the capacitive amplifier for at least the ADC conversion phase (s.5.10). Once the reference is no longer required by the reference consuming circuit in the present duty cycle, the capacitive amplifier itself can then also be shut down (s.5.12). The amplifier is then maintained off for the remainder of the duty cycle, and is then turned on again during the next duty cycle of the reference consuming circuit. In this way the voltage reference source 30 is only operated when it is either calibrating (noise filtering and auto-zeroing) immediately before being required, or when it is actually required by the reference consuming circuit, and is powered down at other points in the duty cycle.

Further details of the capacitive amplifier 34 will now be described, with reference to FIGS. 6 to 12.

FIGS. 6 to 11 show the circuit diagram of the capacitive amplifier 34. At its input four parallel switches S1, S2, S3, and S4 are provided, with switch S1 being connected between a first input to which the Vbe signal is input and a first, left hand, plate of a first capacitor C1, and switch S2 being connected between the circuit ground and the first, left-hand, plate of C1 The arrangement of switches S3 and S4 is similar, with switch S3 being connected between a second input to which the Dvbe signal is input and a first, left hand, plate of a second capacitor C2, and switch S4 being connected between the circuit ground and the first, left-hand, plate of C2. The second, right hand, plates of capacitors C1 and C2 are then connected to a common node which forms the input node of a voltage amplifier G. A fifth switch S5 is also connected between the common node and the circuit ground. A second input node of the voltage amplifier G is also connected to the circuit ground.

At the output of the voltage amplifier G is a resistor R1, capacitor Caz, and transconductance amplifier gm2, all connected in series in that order. In order to allow the resistor R1 and transconductance amplifier gm2 to be switched in and out of the series combination, respective switches S8 and S9 are connected in parallel with the resistor R1 and transconductance amplifier gm2, with switch S8 being connected in parallel with resistor R1, and switch S9 being connected in parallel with transconductance amplifier gm2. Capacitor Caz is in series between the two R1-S8 and gm2-S9 parallel combinations.

The output of transconductance amplifier gm2 forms the output of the reference circuit at which Vref is established, but this output is also fed back to the input of the voltage amplifier G via a feedback network comprising switches S6 and S7, and capacitor C3. Specifically, the output of the transconductance amplifier gm2 is fed back via switch 36 to the right hand plate of capacitor C3, to which node is also connected one side of switch S7. The other side of switch S7 is connected to the circuit ground, to enable the right hand plate of C3 to be grounded. The left hand plate of C3 is connected to the common node at the input of the voltage amplifier G, in order to complete the feedback loop.

In the above circuit the switches S1 to S8 will typically be FET based switches, with appropriate controlling logic to switch the switches at the appropriate time being provided by conventional digital control circuitry, not shown. Hence, in the following where a switch is referred to as "open" then that means that the FET that forms the switch is turned off and not conducting current therethrough, whereas when a switch is referred to as "closed" then the FET that forms the switch is turned on, and acting to conduct current therethrough.

With the above circuit arrangement, the operation of the capacitive amplifier to act as a voltage reference source will now be described, first with reference again to FIG. 6, and with reference to the flow diagram in FIG. 12.

Figure 6:
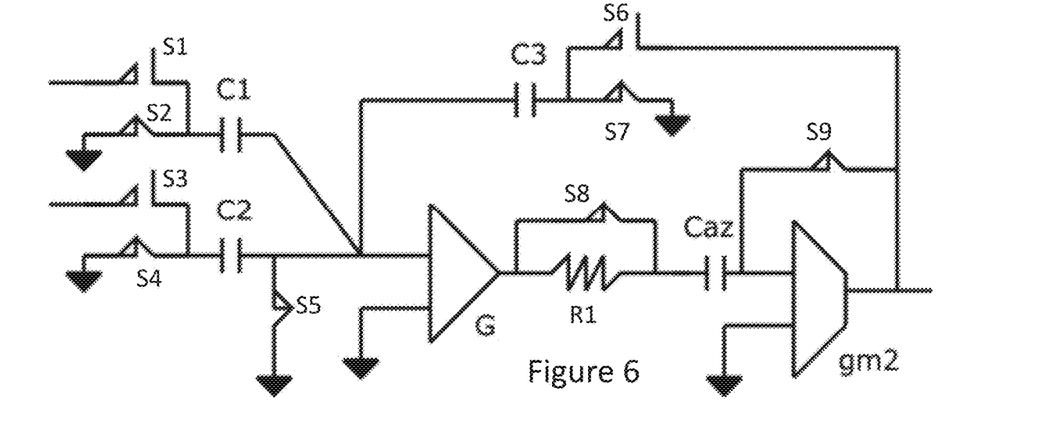
FIGS. 6 to 11 are circuit diagrams of a voltage reference circuit according to a further example of the present disclosure, at respectively different operating points in time.

The operation of the capacitive amplifier is a multi-stage operation, including power up, auto-zeroing, noise-filtering, and operational stages. FIG. 6 shows the capacitive amplifier in the powered down mode. Here, switches S1, S3 and S6 are open, and switches S2, 34, S5, S7, S8, and S9 are closed. In this configuration both plates of all of the capacitors C1, C2, and C3 are connected to the circuit ground and hence the capacitors are discharged. The voltage amplifier G and transconductance amplifier gm2 are off, and hence no power is being consumed. Moreover, switches S8 and S9 are closed and hence are shorting resistor R1 and transconductance amplifier gm2 out of the circuit. To start operation when in this mode, the control circuitry begins to power up the voltage amplifier G and the transconductance amplifier gm2, and also to power up the bandgap reference source 32 so that it starts to produce Vbe and Dvbe. Once this power up is complete the circuit is then in the operational state shown in FIG. 7. In terms of the timing diagram of FIG. 4, the power-up phase of FIG. 6 corresponds to the very start of the "Power-up, Filter, A-Z" phase shown on the timing diagram of FIG. 4, and to steps 12.2 and 12.4 of the flow diagram of FIG. 12.

Figure 7:
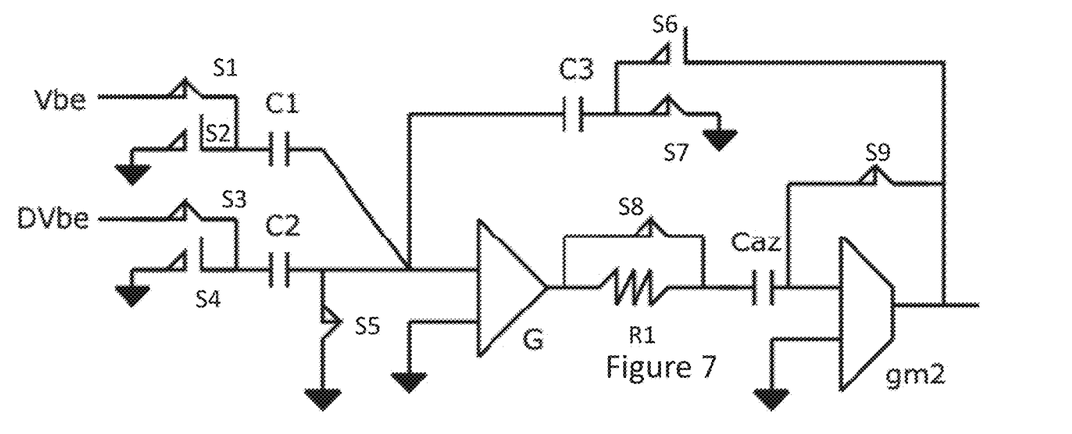

Moving onto FIG. 7, at this point the bandgap reference circuit 32 is operating and the reference signals Vbe and Dvbe are being produced, and are present at the left hand side of switches S1 and S3. Switches S1 and S3 therefore close, and switches S2 and S4 open, so that the left hand plates of capacitors C1 and C2 are exposed to Vbe and Dvbe respectively (s.12.6 of FIG. 12). The right hand plates of C1 and C2 are still connected by the closed switch S5 to the circuit ground, however, and hence capacitors C1 and C2 charge up to the PTAT and CTAT reference voltages Vbe and Dvbe. At the same time as this happens, the voltage amplifier G performs auto-zeroing operations to auto-zero itself (s.12.8 of FIG. 12).

Figure 8:
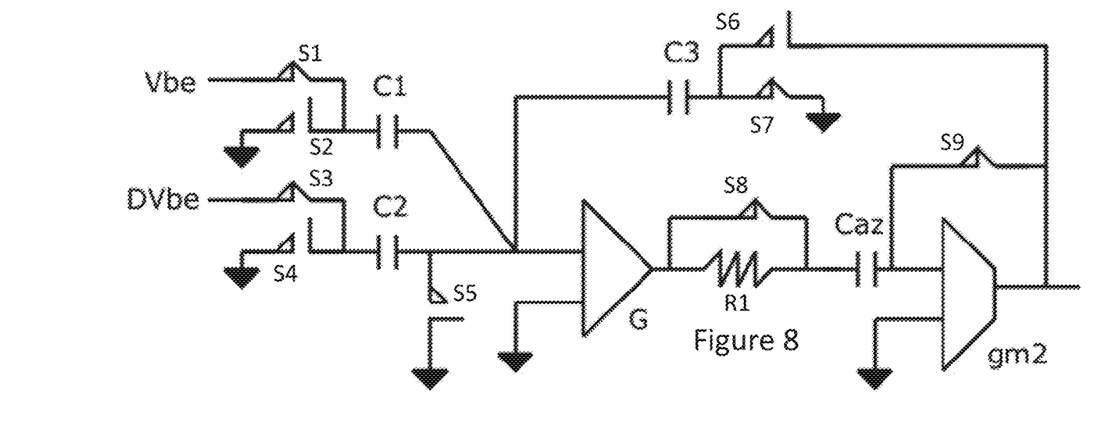

The operation of the circuit then moves on to that shown in FIG. 8. Here, the switch S5 which was connecting the right hand side of capacitors C1 and C2 to ground opens (s.12.10 of FIG. 12), whilst switches S1 and S3 remain closed, connecting the left hand sides of the capacitors respectively to the Vbe and Dvbe sources from the PTAT/CTAT reference circuit 32. The act of opening switch S5 and removing the connection to the circuit ground of the input node of the voltage amplifier G causes a noise charge that is inherently present on the right hand plates (aka top plates) of capacitors C1 and C2 to be input into the non-inverting input of the voltage amplifier G, with the noise charge then being captured as part of the auto-zeroing process of the amplifier G. More specifically, the noise charge that is input to the amplifier G is amplified by the amplifier, and causes an amplifier noise signal to be output by the amplifier, that is fed, via switch S8 which is closed, to the auto-zero capacitor Caz. Caz then stores an amplified version of the sampled noise as an amplified noise charge (see. s.12.14), which will be used later as an input to the transconductance amplifier gm2 to remove the noise.

Figure 9:
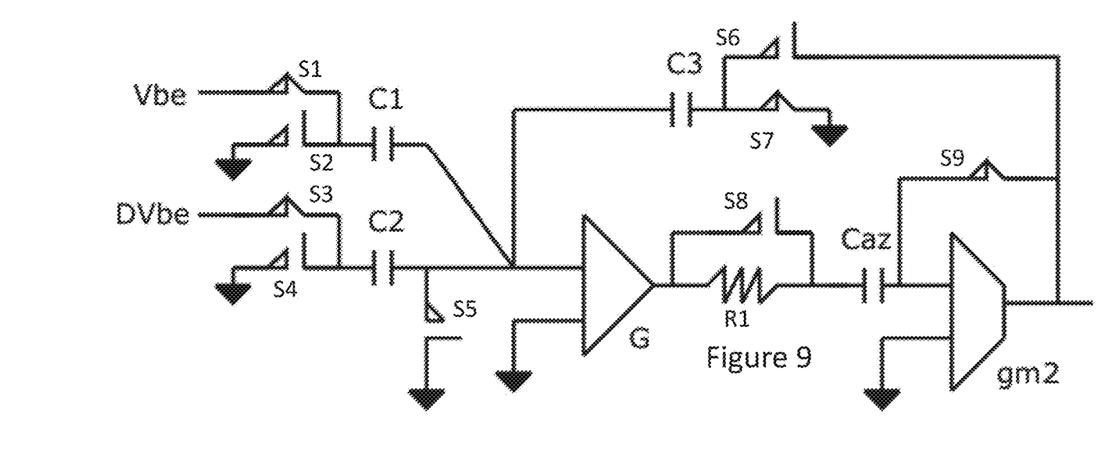
Figure 12:
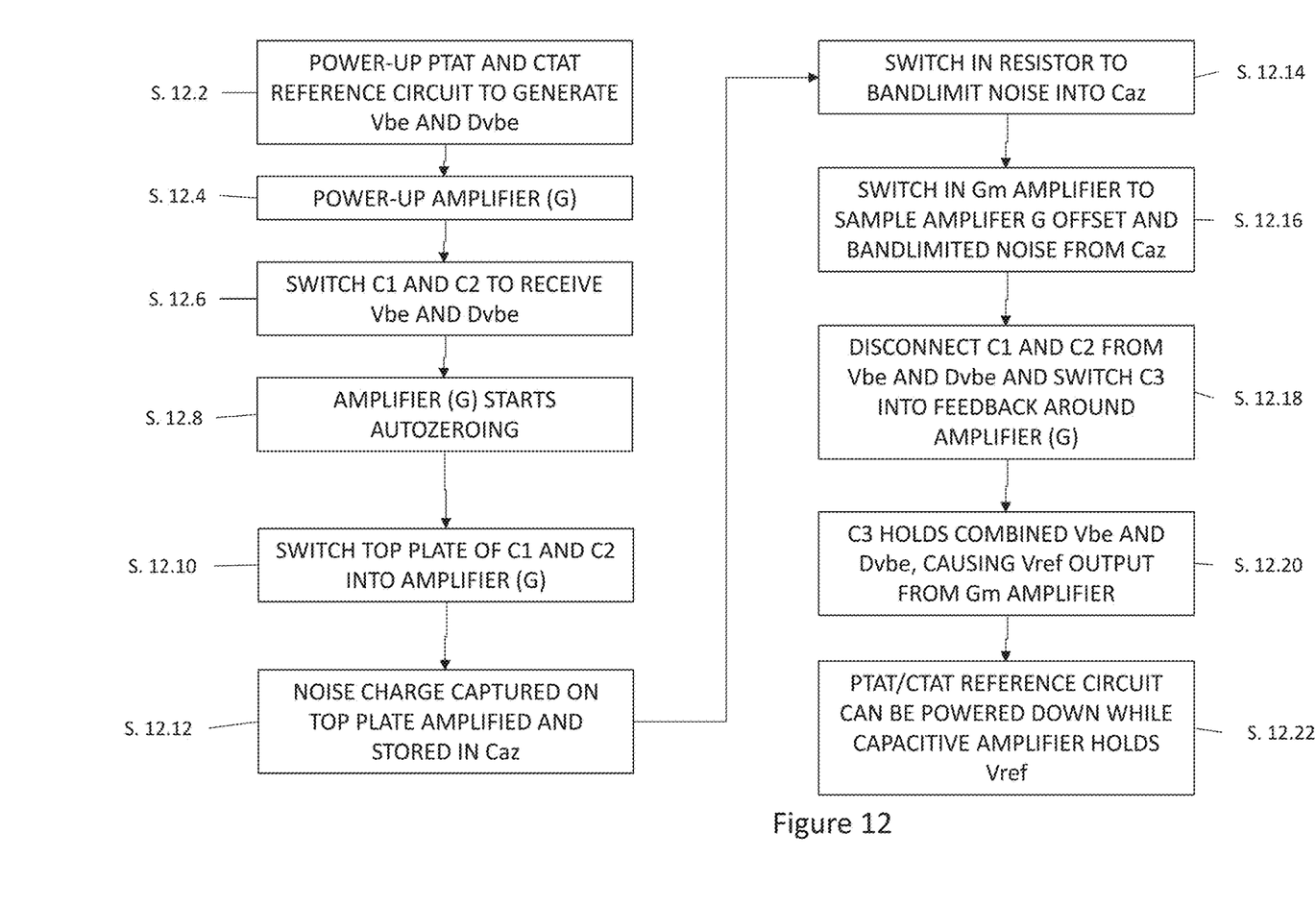
FIG. 12 is a flow diagram illustrating the operation of the voltage reference circuit of FIGS. 6 to 11.

Before using the transconductance amplifier gm2 to sample the noise signal held on Caz, however, as shown in FIG. 9 switch S8 is opened to switch resistor R1 into the circuit in series between the output of the voltage amplifier G and Caz (s.12.14 in FIG. 12). The reason for the inclusion of this resistor is that in order to enable sampling of the offset of the amplifier and the sampled noise held on Caz from the step shown in FIG. 8, we need to open S9 across the transconductance amplifier gm2. This would cause the noise voltage across the capacitor Caz to be sampled by the amplifier, and the unwanted offsets and noise to then be removed. However, performing this operation in itself also introduces sampled noise again, and hence in order to keep this sampled noise as small as possible the resistor R1 is included and switched into the circuit to perform some filtering of the noise being output by the amplifier G before sampling the noise voltage held on Caz by the transconductance amplifier gm2. In this respect, the resistor R1 in series with the capacitor Caz acts as a low pass filter and serves to band-limit the amplified noise being output from the voltage amplifier G before sampling by the transconductance amplifier gm2.

Figure 10:
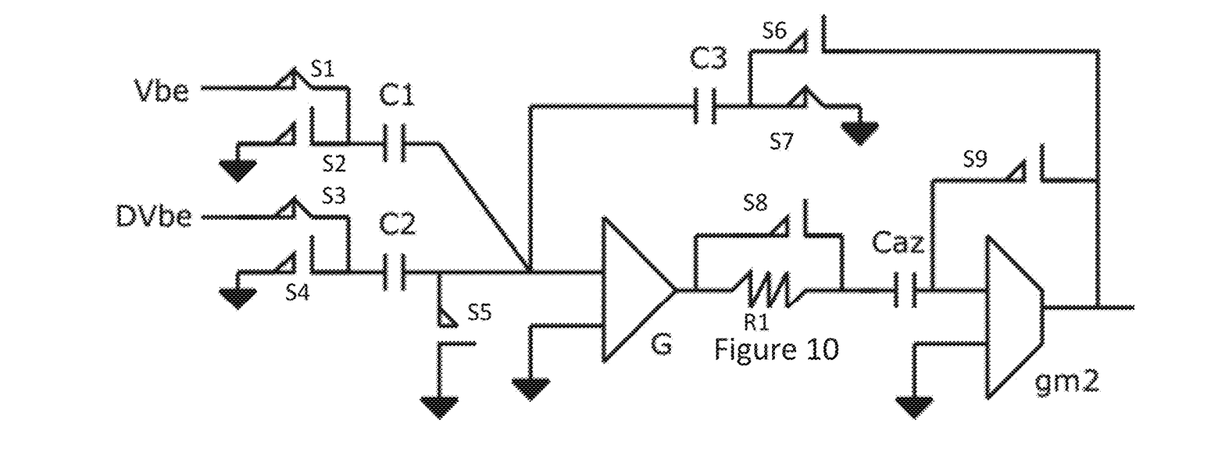

With the low pass filter formed by R1 and Caz then operating, it then becomes possible to switch in the transconductance amplifier gm2, by opening switch S9, as shown in FIG. 10 (s.12.16 in FIG. 12). The transconductance amplifier gm2 samples the bandlimited noise and offset voltages held on Caz, and outputs them around the feedback loop so that they can be removed from the ultimate output signal. This step forms the last calibration step required, and the capacitive amplifier is then ready after this step to output the reference signal Vref. In terms of the timing diagram of FIG. 4, all of the above described operations occur during the "power-up, filter, A-Z" phase shown in each duty cycle, prior to Vref being produced.

Figure 11:
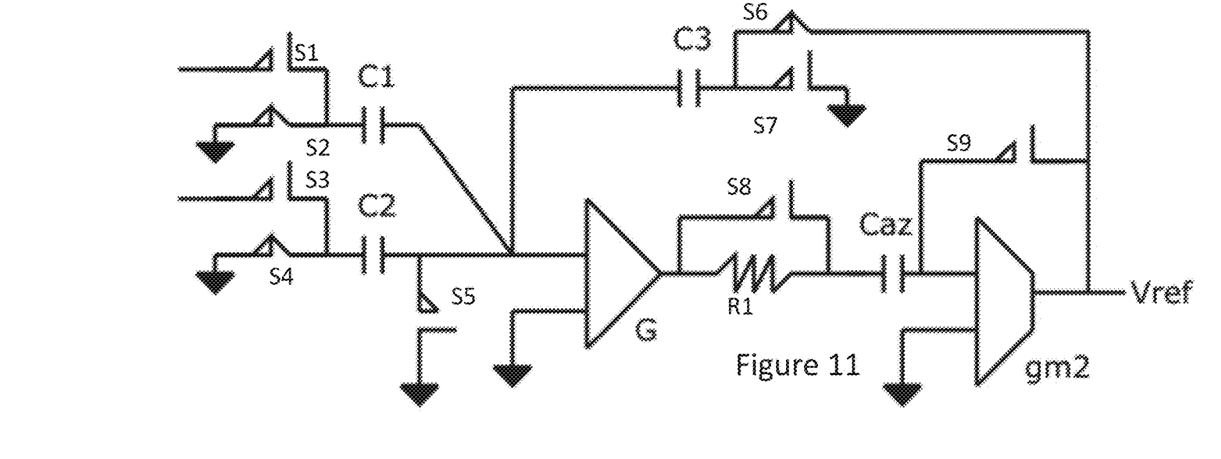

The capacitive amplifier next moves into the operational mode to produce Vref, shown in FIG. 11. This happens by disconnecting C1 and C2 from Vbe and Dvbe, and switching C3 into feedback around the voltage amplifier G and transconductance amplifier gm2 (s.12.18 of FIG. 12). This is achieved by switches S1 and S3 opening, and switches S2 and S4 closing. In addition, switch S6 closes and switch S7 opens in order to complete the feedback loop around the amplifier. This switching has the effect that left hand plates (bottom plates) of capacitors C1 and C2 are grounded, so they push in charge into the virtual ground of the amplifier equivalent to Vbe and Dvbe, which charge then combines in C3. C3 is put in feedback around the voltage amplifier G and transconductance amplifier gm2, to then cause the combined reference Vref to be produced at the amplifier output (s.12.20 of FIG. 12). The absolute value of the reference Vref is determined by the value of the capacitors C1, C2 and C3 in addition to the values of Vbe and Dvbe, and is given by:

$$V_{ref} = \frac{C_1 V_{be} + C_2 DV_{be}}{C_3}$$

As a result, the absolute value of Vref can be trimmed for temperature compensation by adjusting the relative values of C1, C2, and C3 in accordance with the above.

One feature of the circuit is that once the reference voltage Vref has been established by the feedback loop around the voltage amplifier G and the transconductance amplifier gm2 then whilst the amplifiers remain powered up the Vref output will be held, irrespective of the operation of the bandgap voltage reference source 32. As a result, in order to save power once the reference Vref is up and being held the bandgap voltage reference circuit 32 can be powered down while the capacitive amplifier 34 holds the Vref output (s.12.22 in FIG. 12).

This further reduces overall power consumption of the whole voltage reference circuit 30.

With the above, therefore, a temperature independent voltage reference is provided that does not require any large capacitors on its output, and that is able to operate only when the actual reference signal is required by a reference consuming circuit, and can be powered down at other times, thereby reducing power consumption overall.

Various modifications may be made to the above described arrangement to provide further examples, and in particular by combining different voltages on C1, C2, and C3 during the auto-zero phase. For example, in a first further example C1 could be fed a sum of Vbe and Dvbe, with C2 receiving Dvbe as in the above example. C3 is then connected to ground. Such a combination allows C2 to be smaller than the original example described above, since only a correction term is needed. Such a modification improves the noise performance of the system.

In a second further example, C1 is not used, and C2 receives Dvbe, with a signal corresponding to a sum of Vbe and Dvbe being put onto C3. This combination eliminates C1 and improves the noise gain of the voltage amplifier G. However, whether it yields lower noise overall depends on the noise densities of the Vbe and Dvbe generators. For the best noise performance, the Dvbe generator may be built using stacks of individual Dvbe cells.

Various further modifications, whether by way of addition, deletion, or substitution may be made to the above mentioned examples to provide further examples, any and all of which are intended to be encompassed by the appended claims.

What is claimed is:

1. A temperature stabilized reference voltage circuit for supplying a temperature stabilized reference voltage signal (Vref) to a second circuit that requires the reference voltage signal, the temperature stabilized reference voltage circuit comprising:
    a bandgap voltage reference circuit arranged in use to generate a complementary to absolute temperature (CTAT) signal (Vbe) and a proportional to absolute temperature (PTAT) signal (Dvbe); and
    a capacitive amplifier arranged to receive the CTAT and PTAT signals generated by the bandgap voltage reference circuit, and to combine the CTAT and PTAT signals to produce a temperature stabilized reference voltage signal (Vref) that is output in use to the second circuit that requires the reference voltage signal;
    wherein the temperature stabilized reference voltage circuit is in use operated synchronously with the second circuit such that the capacitive amplifier makes the reference voltage signal available to the second circuit at least immediately prior to the start of and during a time period in a duty cycle of the second circuit when the second circuit will make use of the reference voltage signal, and the temperature stabilized reference voltage circuit is powered down and does not provide the reference voltage signal at other times in the duty cycle of the second circuit; and
    wherein the bandgap voltage reference circuit provides the PTAT and CTAT signals to the capacitive amplifier during a calibration phase whilst the reference voltage signal is being established, and then once the reference voltage signal is established the bandgap voltage reference circuit is powered down.

2. A temperature stabilized reference voltage circuit according to claim 1, wherein the circuit powers up sufficiently before the time period in the duty cycle of the second circuit when the second circuit will make use of the reference voltage signal to allow calibration to occur.

3. A temperature stabilized reference voltage circuit according to claim 2, wherein the calibration comprises one or both of:
   i) auto-zeroing; and
   ii) noise filtering.

4. A temperature stabilized reference voltage circuit according to claim 1, wherein the second circuit is an analog-to-digital converter (ADC), and the capacitive amplifier makes the reference voltage signal available to the ADC at least immediately prior to the conversion phase of the ADC, the temperature stabilized reference voltage circuit being powered down between ADC conversion phases.

5. A temperature stabilized reference voltage circuit according to claim 4, wherein the temperature stabilized reference voltage circuit powers up sufficiently in advance of an ADC conversion phase to allow calibration operations to be complete and the reference voltage signal to be established synchronously with the start of the ADC conversion phase.

6. A temperature stabilized reference voltage circuit according to claim 5, wherein the temperature stabilized reference voltage circuit powers down immediately after the end of the ADC conversion phase.

7. A capacitive amplifier for generating a temperature stabilized reference voltage signal (Vref), the capacitive amplifier comprising:
   a capacitive network including at least one input capacitor and at least one feedback capacitor;
   a voltage amplifier in series with a calibration capacitor and a transconductance amplifier, the feedback capacitor of the capacitive network providing in use a feedback loop from the output of the transconductance amplifier to the input of the voltage amplifier; and
   a resistor in series with the output of the voltage amplifier and the calibration capacitor;
   wherein in use the capacitive network receives a complementary to absolute temperature (CTAT) signal (Vbe) and a proportional to absolute temperature (PTAT) signal (Dvbe) and stores signals derived therefrom on one or more of the input capacitor and the feedback capacitor, noise in the signals being amplified by the voltage amplifier to give a resulting amplified noise signal that is stored in the calibration capacitor during a calibration operation of the capacitive amplifier, the resistor being connected in series with the calibration capacitor to provide a band-limiting filter to band-limit the amplified noise signal.

8. A capacitive amplifier according to claim 7, wherein the capacitive network comprises two input capacitors and one feedback capacitor, a first one of the two input capacitors having a first plate that is connectable to the CTAT signal (Vbe), and a second one of the two input capacitors having a first plate connectable to the PTAT signal (Dvbe), respective second plates of the two input capacitors being connected to the input of the voltage amplifier.

9. A capacitive amplifier according to claim 7, wherein the capacitive amplifier undertakes the calibration operation prior to producing a voltage reference.

10. A capacitive amplifier according to claim 9, wherein the calibration operation includes feeding the band-limited amplified noise signals stored on the calibration capacitor to the input of the transconductance amplifier.

11. A capacitive amplifier according to claim 10, and further comprising at the end of the calibration operation establishing the feedback loop from the output of the transconductance amplifier to the input of the voltage amplifier via the feedback capacitor and at the same time switching the at least one input capacitor so that the input plate thereof is grounded, thereby establishing a combined CTAT and PTAT signal within at least one capacitor of the capacitive network, the voltage amplifier and transconductance amplifier acting to generate the voltage reference in dependence on the combined CTAT and PTAT signal.

12. A method of generating a temperature stabilized reference voltage signal for use by a duty-cycled reference-consuming circuit, the method comprising:
   generating a complementary to absolute temperature (CTAT) signal (Vbe) and a proportional to absolute temperature (PTAT) signal (Dvbe); and
   combining the CTAT and PTAT signals to produce a temperature stabilized reference voltage signal (Vref) that is output in use to the duty-cycled reference-consuming circuit;
   wherein the reference voltage signal is produced at least immediately prior to the start of and during a time period in a duty cycle of the reference-consuming circuit when the reference-consuming circuit will make use of the reference voltage signal, and the reference voltage signal is not produced at other times in the duty cycle of the reference consuming circuit; and
   wherein the PTAT and CTAT signals are generated during a calibration phase whilst the reference voltage signal is being established, and then once the reference voltage signal is established the PTAT and CTAT signals stop being generated.

13. A method according to claim 12, wherein immediately prior to production of the reference voltage signal calibration occurs to ensure the reference voltage signal is produced at a correct signal level.

14. A method according to claim 13, wherein the calibration comprises one or both of:
   i) auto-zeroing; and
   ii) noise filtering.

15. A method according to claim 12, wherein the reference consuming circuit is an analog-to-digital converter (ADC), and the reference voltage signal is available to the ADC at least immediately prior to the conversion phase of the ADC, the reference voltage signal being unavailable by not being produced between ADC conversion phases.

16. A method according to claim 15, and further comprising undertaking calibration operations sufficiently in advance of an ADC conversion phase to allow the calibration operations to be complete and the reference voltage signal to be established synchronously with the start of the ADC conversion phase.

17. A method according to claim 16, wherein the reference voltage ceases to be produced immediately after the end of the ADC conversion phase.

18. A temperature stabilized reference voltage circuit for supplying a temperature stabilized reference voltage signal (Vref) to a second circuit that requires the reference voltage signal, the temperature stabilized reference voltage circuit comprising:
   a bandgap voltage reference circuit arranged in use to generate a complementary to absolute temperature (CTAT) signal (Vbe) and a proportional to absolute temperature (PTAT) signal (Dvbe); and
   a capacitive amplifier, arranged to receive the CTAT and PTAT signals generated by the bandgap voltage reference circuit, and to combine the CTAT and PTAT signals to produce a temperature stabilized reference voltage signal (Vref) that is output in use to the second circuit that requires the reference voltage signal, the capacitive amplifier including or present in combination with a capacitive network including at least one input capacitor and at least one feedback capacitor;

wherein the temperature stabilized reference voltage circuit is in use operated synchronously with the second circuit such that the capacitive amplifier makes the reference voltage signal available to the second circuit at least immediately prior to the start of and during a time period in a duty cycle of the second circuit when the second circuit will make use of the reference voltage signal, and the bandgap voltage reference circuit is powered down at times in the duty cycle of the second circuit.

19. The temperature stabilized reference voltage circuit of claim 18, the capacitive amplifier comprising:

a voltage amplifier in series with a calibration capacitor and a transconductance amplifier, the feedback capacitor of the capacitive network providing in use a feedback loop from the output of the transconductance amplifier to the input of the voltage amplifier; and a resistor in series with the output of the voltage amplifier and the calibration capacitor.

20. The temperature stabilized reference voltage circuit of claim 19, wherein in use the capacitive network receives a complementary to absolute temperature (CTAT) signal (Vbe) and a proportional to absolute temperature (PTAT) signal (Dvbe) and stores signals derived therefrom on one or more of the input capacitor and the feedback capacitor, noise in the signals being amplified by the voltage amplifier to give a resulting amplified noise signal that is stored in the calibration capacitor during a calibration operation of the capacitive amplifier, the resistor being connected in series with the calibration capacitor to provide a band-limiting filter to band-limit the amplified noise signal.

* * * * *